United States Patent
Poorrezaei et al.

(10) Patent No.: US 10,433,197 B2
(45) Date of Patent: Oct. 1, 2019

(54) COMPENSATING FOR OSCILLATOR DRIFT IN WIRELESS MESH NETWORKS

(71) Applicant: Silver Spring Networks, Inc., San Jose, CA (US)

(72) Inventors: Kamal Poorrezaei, San Jose, CA (US); Brandon Inberg, Belmont, CA (US)

(73) Assignee: ITRON NETWORKED SOLUTIONS, INC., Liberty Lake, WA (US)

(*) Notice: Subject to any disclaimer, the term of this patent is extended or adjusted under 35 U.S.C. 154(b) by 124 days.

(21) Appl. No.: 15/655,781

(22) Filed: Jul. 20, 2017

(65) Prior Publication Data

US 2019/0028910 A1    Jan. 24, 2019

(51) Int. Cl.
| | | |
|---|---|---|
| H04W 24/08 | (2009.01) | |
| H04L 27/152 | (2006.01) | |
| H04W 48/16 | (2009.01) | |
| H04W 84/18 | (2009.01) | |

(52) U.S. Cl.
CPC .......... *H04W 24/08* (2013.01); *H04L 27/152* (2013.01); *H04W 48/16* (2013.01); *H04W 84/18* (2013.01)

(58) Field of Classification Search
CPC .................................................... H04W 24/08
USPC ............................................................ 331/1 A
See application file for complete search history.

(56) References Cited

U.S. PATENT DOCUMENTS

| | | | |
|---|---|---|---|
| 5,517,678 A | * | 5/1996 | Klank ................. H03J 1/005 455/164.2 |
| 7,072,432 B2 | | 7/2006 | Belcea |
| 7,791,419 B1 | | 9/2010 | Lemkin |
| 9,455,727 B2 | | 9/2016 | Li et al. |
| 2003/0152177 A1 | | 8/2003 | Cahill-O'Brien et al. |
| 2006/0071724 A1 | | 4/2006 | Bartholomew |
| 2008/0001779 A1 | | 1/2008 | Cahill-O'Brien et al. |
| 2008/0068217 A1 | | 3/2008 | Van Wyk et al. |
| 2010/0202436 A1 | | 8/2010 | Albert et al. |
| 2012/0002547 A1 | | 1/2012 | Picard |

(Continued)

OTHER PUBLICATIONS

International Search Report and Written Opinion dated Nov. 20, 2018, in connection with International Application No. PCT/JP2018/041735.

(Continued)

*Primary Examiner* — Joseph Chang
(74) *Attorney, Agent, or Firm* — Artegis Law Group, LLP

(57) ABSTRACT

A battery powered node within a wireless mesh network maintains a mapping between temperature and oscillator drift and compensates for oscillator drift based on this mapping. When the mapping includes insufficient data points to map the current temperature to an oscillator drift value, the battery powered node requests calibration packets from an adjacent upstream node in the network. The adjacent node transmits two calibration packets with a transmit time delta and also indicates this time delta in the first calibration packet. The battery powered node receives the two calibration packets and measures the receive time delta. The battery powered node compares the transmit time delta to the receive time delta to determine oscillator drift compared to an oscillator in the adjacent node. The battery powered node then updates the mapping based on the current temperature and determined oscillator drift.

20 Claims, 9 Drawing Sheets

(56) References Cited

U.S. PATENT DOCUMENTS

2013/0336080 A1    12/2013    Frans et al.

OTHER PUBLICATIONS

Sommer et al., "Gradient Clock Synchronization in Wireless Sensor Networks", ACM 2009, URL: https://www.tik.ee.ethz.ch/file/6f8421f5ade4294a9e92b8ce197c05d3/ipsn09.pdf, 12 pages.

\* cited by examiner

COMPENSATING FOR OSCILLATOR DRIFT IN WIRELESS MESH NETWORKS

BACKGROUND OF THE INVENTION

Field of the Invention

Embodiments of the present invention relate generally to wireless network communications and, more specifically, to compensating for oscillator drift in wireless mesh networks.

Description of the Related Art

A conventional wireless mesh network includes a plurality of nodes configured to communicate with one another. In certain types of heterogeneous wireless mesh networks, both continuously-powered nodes (CPDs) and battery-powered nodes (BPDs) communicate and interact with one another within the mesh network. Typically, CPDs are coupled to a power grid and have continuous access to power (except during power outages). BPDs, on the other hand, are battery-powered and therefore have only a finite supply of power.

Due to these power constraints, BPDs normally remain in a powered down state, and then only power on at specifically timed communication intervals to perform data communications with one another and with CPDs. In order to power on at similarly timed intervals, BPDs include low-frequency oscillators according to which current time is maintained. Such oscillators are usually crystals having a particular resonant frequency. That resonant frequency may change over time based on the ambient temperature and/or various temperature fluctuations, a phenomenon that is known in the art as "temperature induced oscillator drift" or simply "clock drift." Clock drift may affect the timing with which BPDs power on to perform data communications. If the clock drift of a given BPD becomes too large, then the BPD may power on too early or too late and, consequently, miss the predetermined communication interval. In such situations, the BPD can become disconnected from the wireless mesh network.

One solution to the above problem is to include a temperature-compensated crystal oscillator (TCXO) within each BPD. However, such a solution is not practicable with battery-powered devices, like BPDs, because typical TCXOs consume relatively large amounts of power.

As the foregoing illustrates, what is needed in the art are a more effective techniques for compensating for oscillator drift in a battery powered device.

SUMMARY OF THE INVENTION

One embodiment of the present invention sets forth a computer-implemented method for compensating for oscillator drift, including acquiring, at a first node residing in a wireless mesh network, a first calibration packet from a second node residing in the wireless mesh network, acquiring, at the first node, a second calibration packet from the second node after a first period of time has elapsed, comparing the first period of time to a second period of time specified in the first calibration packet to determine a first drift value associated with an oscillator included in the first node, and adjusting the oscillator to compensate for the first drift value.

At least one advantage of the techniques described herein is that battery powered nodes can compensate for temperature induced oscillator drift based on the highly accurate oscillators included in continuously powered devices, without implementing power consuming TCXO techniques.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
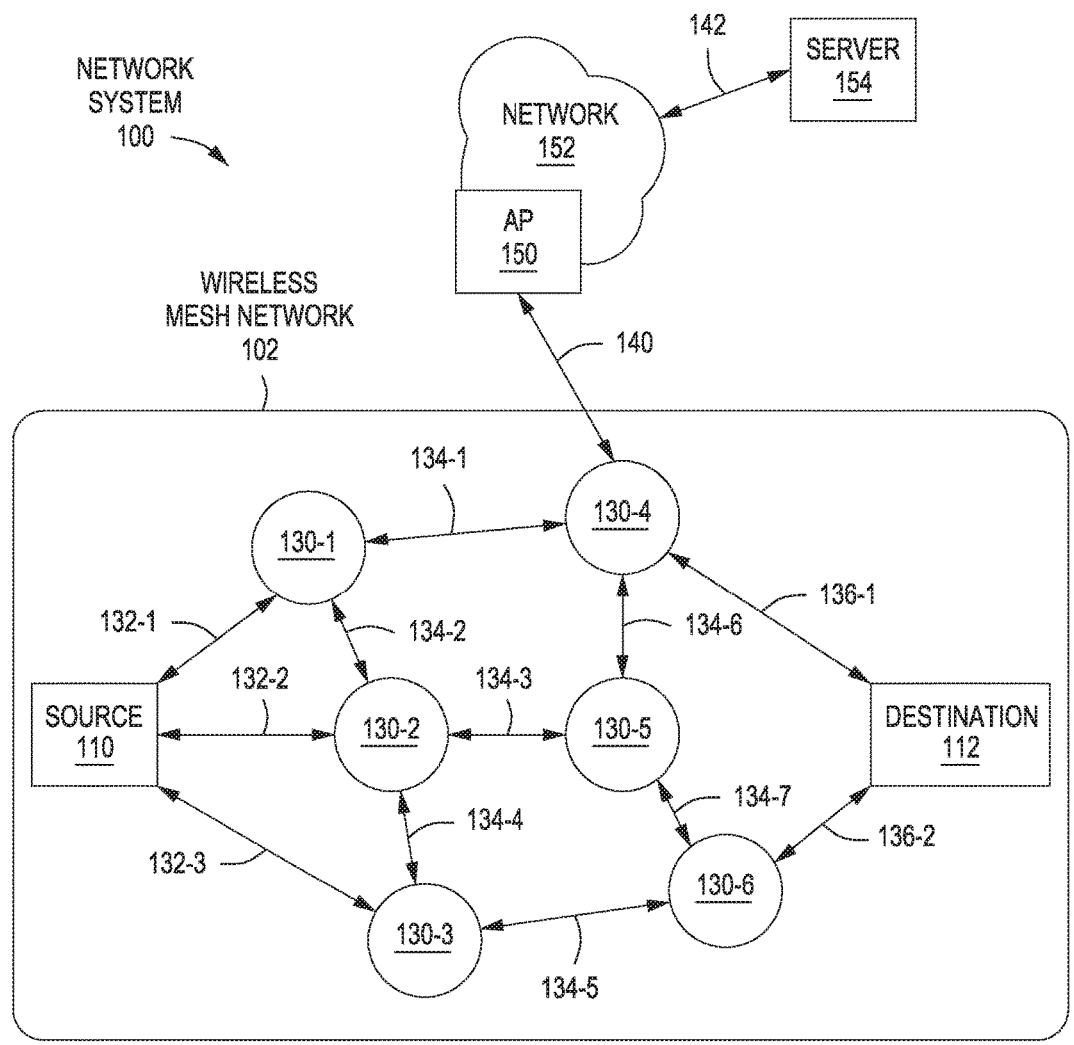
FIG. 1 illustrates a network system configured to implement one or more aspects of the present invention.

FIG. 1 illustrates a network system configured to implement one or more aspects of the present invention. As shown, the network system 100 includes a wireless mesh network 102, which may include a source node 110, intermediate nodes 130 and destination node 112. The source node 110 is able to communicate with certain intermediate nodes 130 via communication links 132. The intermediate nodes 130 communicate among themselves via communication links 134. The intermediate nodes 130 communicate with the destination node 112 via communication links 136. The network system 100 may also include an access point 150, a network 152, and a server 154.

A discovery protocol may be implemented to determine node adjacency to one or more adjacent nodes. For example, intermediate node 130-2 may execute the discovery protocol to determine that nodes 110, 130-1, 130-3, and 130-5 are adjacent to node 130-2. Furthermore, this node adjacency indicates that communication links 132-2, 134-2, 134-4 and 134-3 may be established between the nodes 110, 130-1, 130-3, and 130-5, respectively. Any technically feasible discovery protocol may be implemented without departing from the scope and spirit of embodiments of the present invention.

The discovery protocol may also be implemented to determine the hopping sequences of adjacent nodes, i.e. the sequence of channels across which nodes periodically receive payload data. As is known in the art, a "channel" may correspond to a particular range of frequencies. Once adjacency is established between the source node 110 and at least one intermediate node 130, the source node 110 may generate payload data for delivery to the destination node 112, assuming a path is available. The payload data may comprise an Internet protocol (IP) packet, or any other technically feasible unit of data. Similarly, any technically feasible addressing and forwarding techniques may be implemented to facilitate delivery of the payload data from the source node 110 to the destination node 112. For example, the payload data may include a header field configured to include a destination address, such as an IP address or media access control (MAC) address.

Each intermediate node 130 may be configured to forward the payload data based on the destination address. Alternatively, the payload data may include a header field configured to include at least one switch label to define a predetermined path from the source node 110 to the destination node 112. A forwarding database may be maintained by each intermediate node 130 that indicates which communication link 132, 134, 136 should be used and in what priority to transmit the payload data for delivery to the destination node 112. The forwarding database may represent multiple paths to the destination address, and each of the multiple paths may include one or more cost values. Any technically feasible type of cost value may characterize a link or a path within the network system 100. In one embodiment, each node within the wireless mesh network 102 implements substantially identical functionality and each node may act as a source node, destination node or intermediate node.

In network system 100, the access point 150 is configured to communicate with at least one node within the wireless mesh network 102, such as intermediate node 130-4. Communication may include transmission of payload data, timing data, or any other technically relevant data between the access point 150 and the at least one node within the wireless mesh network 102. For example, communications link 140 may be established between the access point 150 and intermediate node 130-4 to facilitate transmission of payload data between wireless mesh network 102 and network 152. The network 152 is coupled to the server 154 via communications link 142. The access point 150 is coupled to the network 152, which may comprise any wired, optical, wireless, or hybrid network configured to transmit payload data between the access point 150 and the server 154.

The server 154 may represent a destination for payload data originating within the wireless mesh network 102 and a source of payload data destined for one or more nodes within the wireless mesh network 102. The server 154 is generally a computing device, including a processor and memory, that executes an application for interacting with nodes within the wireless mesh network 102. For example, nodes within the wireless mesh network 102 may perform measurements to generate measurement data, such as power consumption data. The server 154 may execute an application to collect the measurement data and report the measurement data. In one embodiment, the server 154 queries nodes within the wireless mesh network 102 for certain data. Each queried node replies with requested data, such as consumption data, system status and health data, and so forth. In an alternative embodiment, each node within the wireless mesh network 102 autonomously reports certain data, which is collected by the server 154 as the data becomes available via autonomous reporting.

The techniques described herein are sufficiently flexible to be utilized within any technically feasible network environment including, without limitation, a wide-area network (WAN) or a local-area network (LAN). Moreover, multiple network types may exist within a given network system 100. For example, communications between two nodes 130 or between a node 130 and the corresponding access point 150 may occur via a radio-frequency local-area network (RF LAN), while communications between access points 150 and the network may be via a WAN such as a general packet radio service (GPRS). As mentioned above, each node within wireless mesh network 102 includes a network interface that enables the node to communicate wirelessly with other nodes. Each node 130 may implement any and all embodiments of the invention by operation of the network interface. An exemplary network interface is described below in conjunction with FIG. 2.

Figure 2:
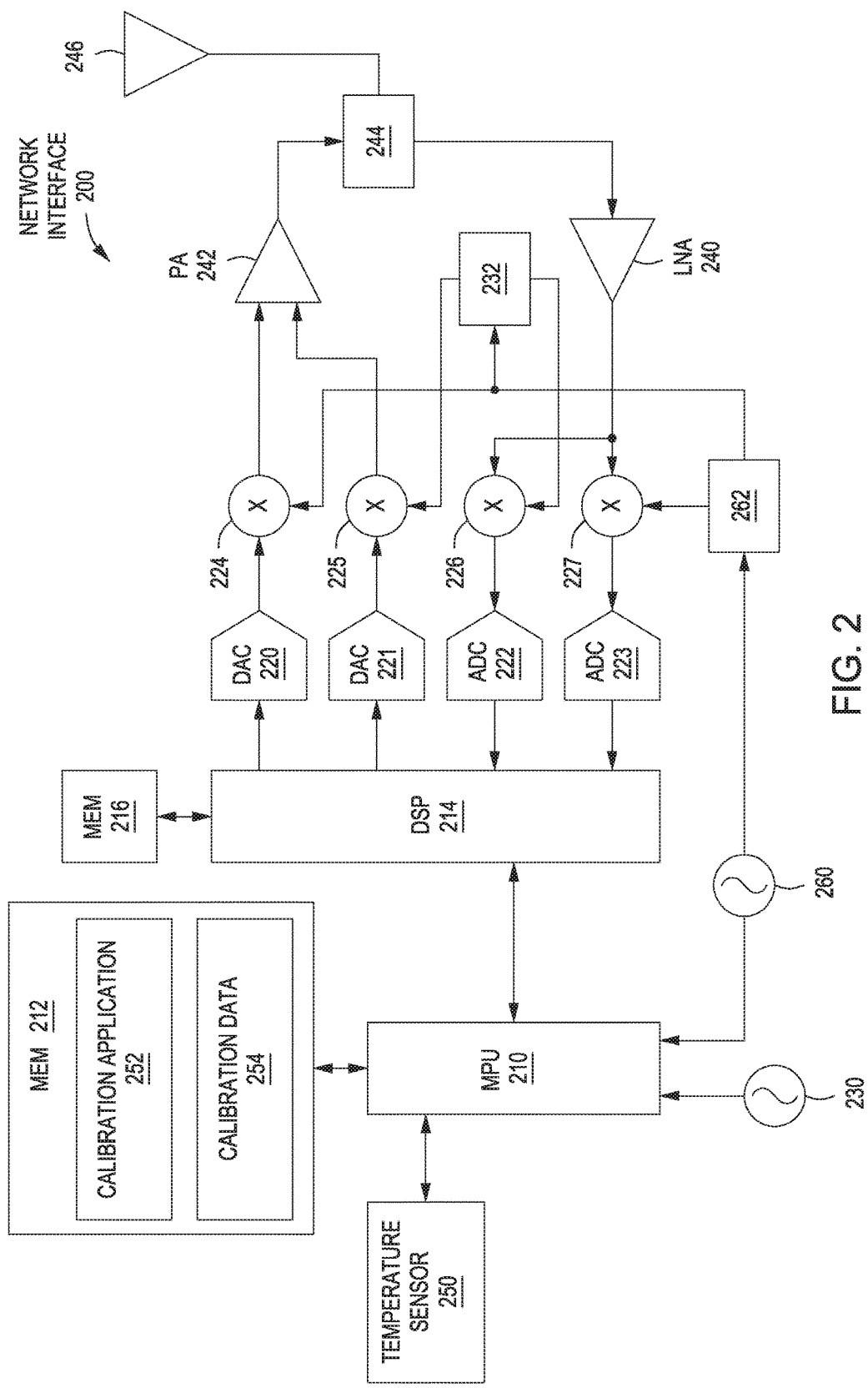
FIG. 2 illustrates a network interface configured to transmit and receive data within the wireless mesh network of FIG. 1, according to various embodiments of the present invention.

FIG. 2 illustrates a network interface configured to transmit and receive data within the mesh network of FIG. 1, according to various embodiments of the present invention. Each node 110, 112, 130 within the wireless mesh network 102 of FIG. 1 includes at least one instance of the network interface 200. The network interface 200 may include, without limitation, a microprocessor unit (MPU) 210, a memory 212, a digital signal processor (DSP) 214, a memory 216, digital to analog converters (DACs) 220, 221, analog to digital converters (ADCs) 222, 223, analog mixers 224, 225, 226, 227, a phase shifter 232, a low frequency (LF) oscillator 230, a power amplifier (PA) 242, a low noise amplifier (LNA) 240, an antenna switch 244, an antenna 246, a temperature sensor 250, a high frequency (HF) oscillator 260, and a phase locked loop (PLL) 262.

Memories 212 and 216 are coupled to MPU 210 and DSP 214, respectively, for local program and data storage. Memory 212 and/or memory 216 may be used to store various types of data, including a forwarding database and/or routing tables that include primary and secondary path information, path cost values, and so forth. Memories 212 and 216 may also store executable program code.

In one embodiment, MPU 210 implements procedures for processing IP packets transmitted or received as payload data by the network interface 200. The procedures for processing the IP packets may include, without limitation, wireless routing, encryption, authentication, protocol translation, and routing between and among different wireless and wired network ports. In one embodiment, MPU 210 implements the techniques performed by the node when MPU 210 executes a firmware program stored in memory within network interface 200.

The MPU 214 is coupled to DAC 220 and DAC 221. Each DAC 220, 221 is configured to convert a stream of outbound digital values into a corresponding analog signal. The outbound digital values are computed by the signal processing procedures for modulating one or more channels. DSP 214 is also coupled to ADC 222 and ADC 223. Each ADC 222, 223 is configured to sample and quantize an analog signal to generate a stream of inbound digital values. The inbound digital values are processed by the signal processing procedures to demodulate and extract payload data from the inbound digital values.

In one embodiment, MPU 210 and/or DSP 214 are configured to buffer incoming data within memory 212 and/or memory 216. The incoming data may be buffered in any technically feasible format, including, for example, raw soft bits from individual channels, demodulated bits, raw ADC samples, and so forth. MPU 210 and/or DSP 214 may buffer within memory 212 and/or memory 216 any portion of data received across the set of channels from which antenna 246 receives data, including all such data. MPU 210 and/or DSP 214 may then perform various operations with the buffered data, including demodulation operations, decoding operations, and so forth. MPU 210 and DSP 214 perform various operations based on oscillation signals received from LF oscillator 230 and HF oscillator 260.

LF oscillator 230 may be coupled to a counter circuit (not shown) configured to maintain an estimate of the current time. MPU 210 is configured to update the current time estimate and other associated data including, for example, an uncertainty estimate associated with the current time estimate. MPU 210 times transmissions based on LF oscillator 230. Memory 212 includes a calibration application 252 that, when executed by MPU 210, performs a calibration procedure to compensate for temperature induced drift of LF oscillator 230. In doing so, calibration application 252 determines a relationship between drift of oscillator 230 and temperature across a range of temperatures measured by temperature sensor 250. Calibration application 252 generates calibration data 254 to represent drift as a function of temperature for LF oscillator 230. Later, based on temperature measurements from temperature sensor 250, calibration application 252 estimates current drift based on current temperature and calibration data 254. Calibration application 252 then corrects for this drift. This procedure is described in greater detail below in conjunction with FIGS. 3A-6.

HF oscillator 260 is coupled to PLL 262 and configured to drive the frequency of the various receiver circuitry shown within network interface 200. That receiver circuitry is configured to sample incoming data transmissions. Calibration application 252 is configured to perform a similar compensation process as that described above to compensate for temperature induced drift of HF oscillator 260. In doing so, calibration application 252 interacts with temperature sensor 250 and certain other circuitry, as described in greater detail below in conjunction with FIGS. 7-8.

Persons having ordinary skill in the art will recognize that network interface 200 represents just one possible network interface that may be implemented within wireless mesh network 102 shown in FIG. 1, and that any other technically feasible device for transmitting and receiving data may be incorporated within any of the nodes within wireless mesh network 102.

Referring generally to FIGS. 1-2, under various circumstances, nodes 130 may transmit messages to server 154 that reflect various operating conditions associated with those nodes 130. The operating conditions associated with a given node 130 could include, for example, a set of environmental conditions and/or events detected by the node 130, status information associated with the portion of the wireless mesh network 202 to which the node 130 is coupled, and status information associated with a utility grid the node 130 is configured to monitor. In addition, nodes 130 may transmit messages to each other according to a transmission schedule. To follow the transmission schedule, each node 130 maintains a current time estimate, as described, that can be updated based on time beacons received from neighboring nodes. In addition, each node may calibrate that clock based on calibration packets received from upstream nodes or other neighboring nodes, as described in greater detail below in conjunction with FIGS. 3A-3B.

Compensating for Drift of a Low Frequency Oscillator

Figure 3A:
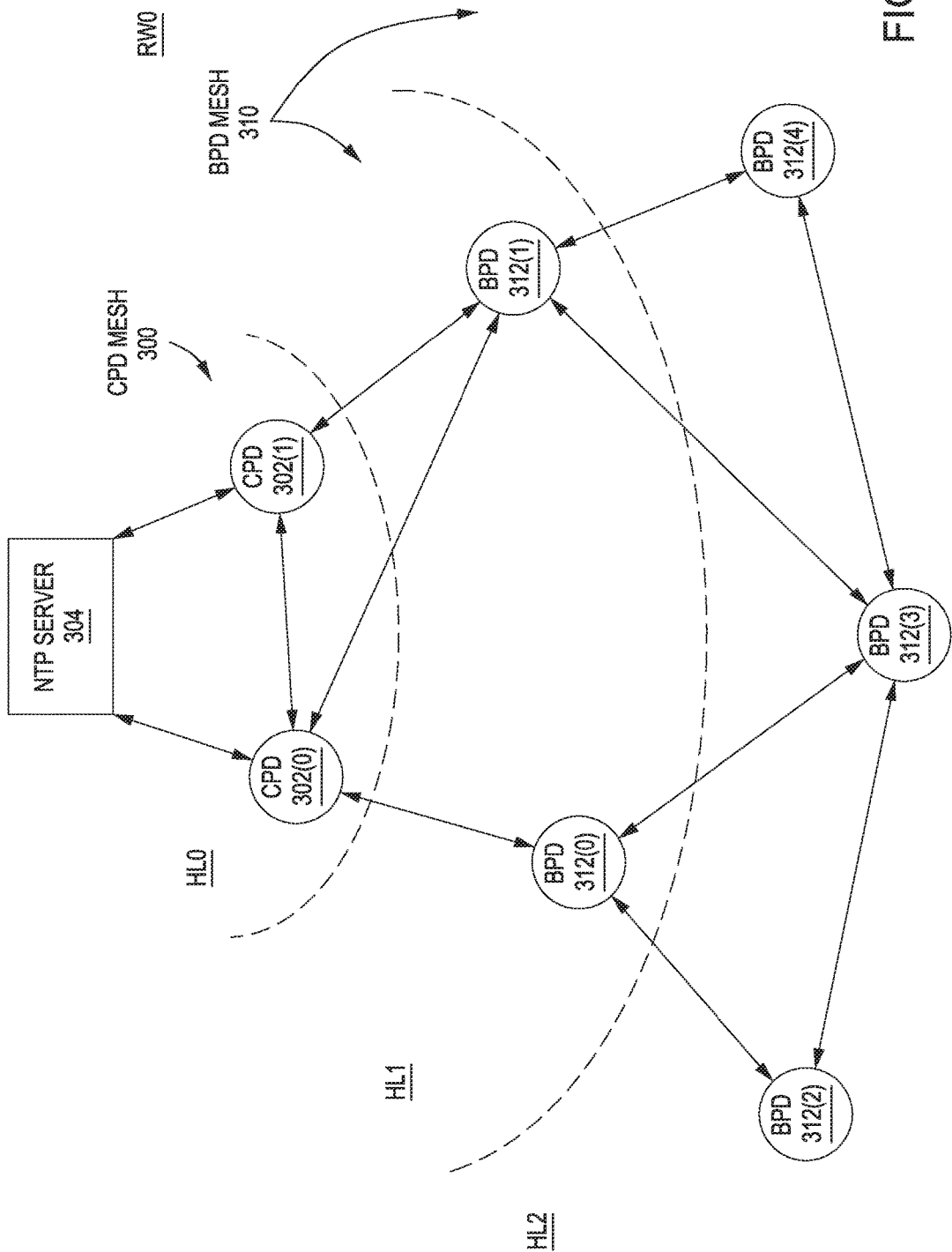
FIGS. 3A-3B illustrate how calibration packets are propagated between layers of nodes within the wireless mesh network of FIG. 1, according to various embodiments of the present invention.
Figure 3B:
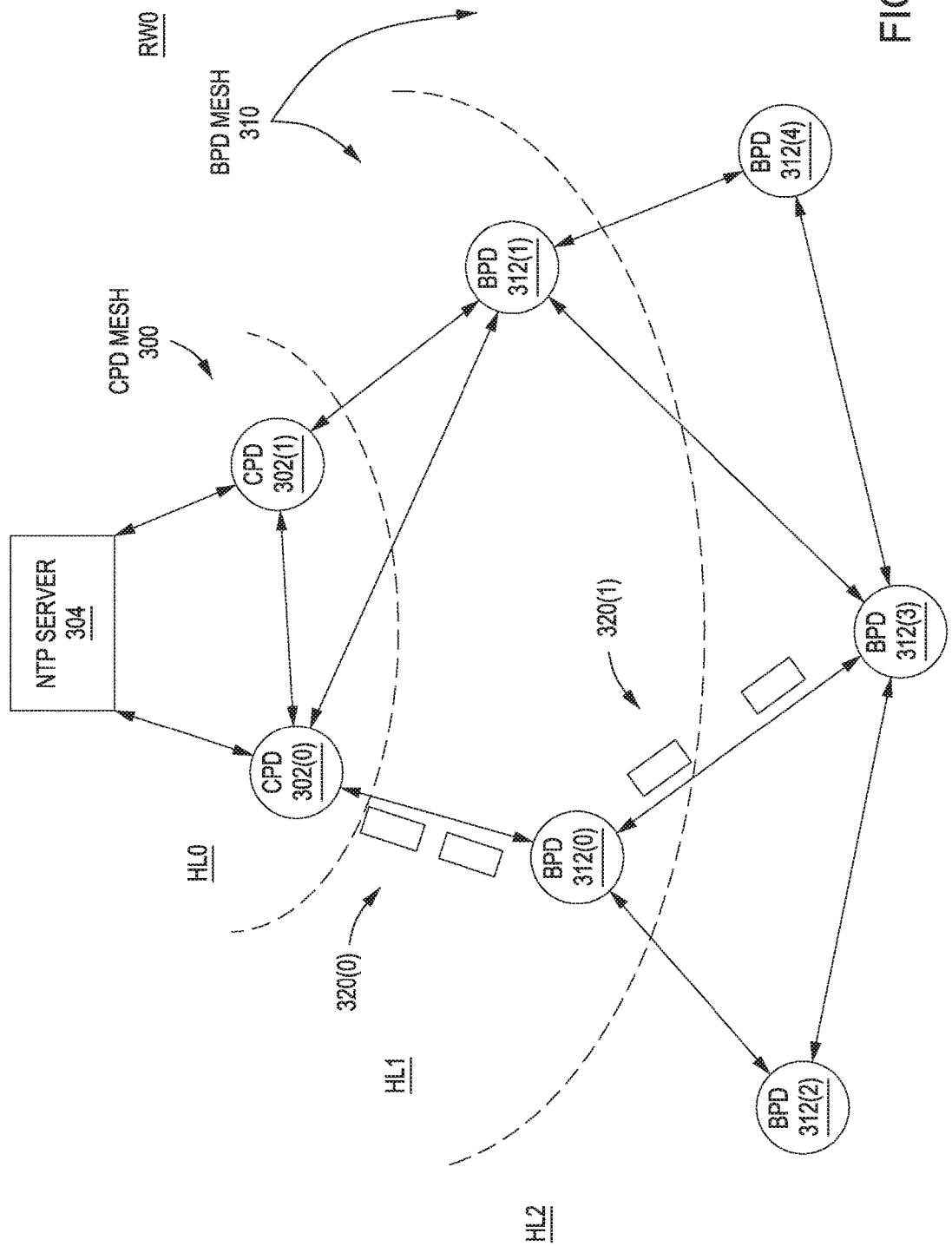

FIGS. 3A-3B illustrate how calibration packets are propagated between layers of nodes within the wireless mesh network of FIG. 1, according to various embodiments of the present invention.

As shown in FIG. 3A, wireless mesh network 102 of FIG. 3A is divided into a continuously-powered device (CPD) mesh 300 and a battery-powered device (BPD) mesh 310. CPD mesh 300 includes CPDs 302(0) and 302(1) as well as a network time protocol (NTP) server 304. CPDs 300 may include one or more nodes 130 and/or APs 150 of FIG. 1. BPD mesh 310 includes BPDs 312(0) through 312(4). BPDs 312 may include one or more nodes 130 of FIG. 1. As a general matter, data that is transmitted from CPD mesh 300 to BPD mesh 310 is referred to herein as "outbound" data and may be described as traveling in an "outbound" or "downlink" direction. Similarly, data that is transmitted from BPD mesh 310 towards CPD mesh 300 is referred to herein as "inbound" data and may be described as traveling in an "inbound" or "uplink" direction.

BPDs 312 of BPD mesh 310 are included in different "hop layers" based on hopping distance to CPD mesh 300. BPDs 312(0) and 312(1) are included in hop layer one (HL1) because those nodes are one hop away from CPD mesh 300. BPDs 312(2) through 312(4) are included in hop layer two (HL2) because those nodes are two hops away from CPD mesh 300. Wireless mesh network 102 is configured to propagate data packets across CPD mesh 300 and BPD mesh 310 in a coordinated manner based on hop layer. Those data packets may include time beacons, calibration packets, network packets, and so forth.

Because BPDs 312 operate with a limited power supply, a given BPD 312 may power down for long periods of time and then power on briefly to perform data communications with other BPDs 312. In order to coordinate the powering on of many BPDs 312, each BPD 312 measures and compensates for temperature induced oscillator drift using a technique described in greater detail below in conjunction with FIGS. 3B-6. By maintaining an accurate estimate of time, many BPDs 312 can power on at approximately the same time, perform data communications, and then power down, thereby minimizing the amount of time each BPD 312 is powered on. Each BPD 312 is configured to measure temperature induced oscillator drift based on calibration packets received from upstream nodes, as described in greater detail below in conjunction with FIG. 3B.

As shown in FIG. 3B, BPD 312(0) receives calibration packets 320(0) from CPD 302(0), and BPD 312(3) receives calibration packets 320(1) from BPD 312(0). A given BPD 312 determines temperature induced oscillator drift based on the difference between receipt times of calibration packets 320. This technique is described in greater detail below in conjunction with FIG. 4. Each BPD 312 may obtain calibration packets from an upstream node. With the exception of BPDs 312 in the outermost hop layer, each BPD 312 may also transmit calibration packets to downstream nodes. Accordingly, the technique described herein can be implemented to determine and compensate for oscillator drift across the entire wireless mesh network 102.

Figure 4:
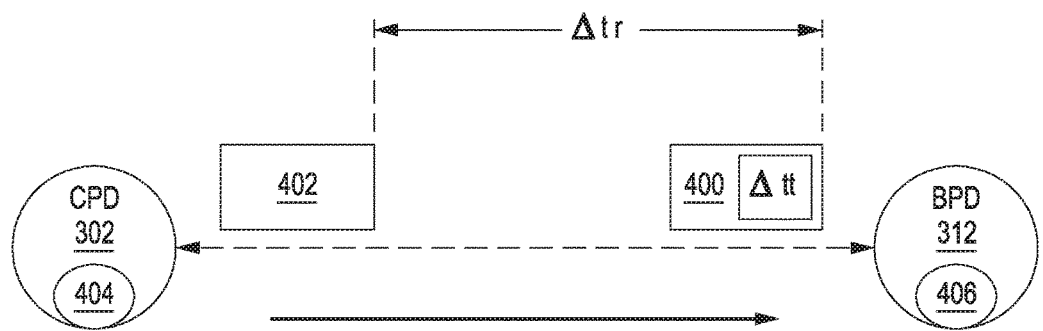
FIG. 4 illustrates how a node determines oscillator drift based on calibration packets received from another node, according to various embodiments of the present invention.

FIG. 4 illustrates how a node determines oscillator drift based on calibration packets received from another node, according to various embodiments of the present invention. As shown, CPD 302 transmits calibration packets 400 and 402 to BPD 312, with transmissions times determined based oscillator 404. CPD 302 transmits calibration packet 400 first, then transmits calibration packet 402 after a short time delta measured by oscillator 404. CPD 302 includes within calibration packet 400 an indication of this time delta, referred to herein as the transmit time delta and shown as Δtt. BPD 312 receives calibration packets 400 and 402 and then measures, via an oscillator 406, the time delta between receipt of calibration 400 and receipt of calibration packet 402. This time delta is referred to herein as the receive time delta or Δtr.

BPD 312 determines the difference between the transmit time delta Δtt and the receive time delta Δtr. Under ideal operating conditions, BPD 312 may determine that the difference between Δtt and Δtr is zero, indicating that oscillator 404 within CPD 302 is substantially synchronized with oscillator 406 within BPD 312. However, under typical operating conditions, oscillators 404 and 406 within CPD 302 and BPD 312, respectively, may not be synchronized for various reasons, including temperature-induced oscillator drift. In some cases, CPD 302 may implement oscillator 404 as a temperature compensated crystal oscillator (TCXO) that is capable of maintaining reasonably accurate time despite temperature fluctuations. BPD 312, on the other hand, generally cannot implement a TCXO due to power limitations. Accordingly, oscillator 406 within BPD 312 may be subject to greater temperature induced oscillator drift compared to oscillator 404 within CPD 302.

BPD 312 is configured to determine this relative oscillator drift based on the difference between Δtt and Δtr. For example, if Δtt is greater than Δtr, then oscillator 406 oscillates at a slightly lower frequency compared to oscillator 404. In this example, BPD 312 does not count as many clock edges of oscillator 406 when measuring Δtr compared to the number of clock edges counted by oscillator 404 when measuring Δtt. Conversely, if Δtt is less than Δtr, then oscillator 406 oscillates at a slightly higher frequency compared to oscillator 404. Specifically, BPD 312 counts more clock edges when measuring Δtr than the number of clock edges counted by oscillator 404 when measuring Δtt.

BPD 312 determines the drift of oscillator 406 based on computing Δtt-Δtr and then performs two operations. First, BPD 312 compensates for this drift so that future data communications occur based on a more accurate time estimate. In doing so, BPD 312 could, for example, correct a number of counted clock edges to account for the determined drift. Second, BPD 312 records the determined drift along with a measurement of the current temperature in order to generate and/or expand a mapping of temperature values to drift values. This particular operation is discussed in greater detail below in conjunction with FIG. 5.

By determining and compensating for drift in the manner described, BPD 312 may maintain a more accurate estimate of the current time and therefore be capable of powering on at precisely timed communication intervals. With precise timing, these communication intervals may be very short, thereby conserving power. In addition, BPD 312 may also then perform the calibration procedure described above with BPDs in downstream hop layers, as described above in conjunction with FIG. 3B. In general, any downstream BPD 312 may request calibration packets from any upstream BPD 312 (or CPD 302) and then perform the two-packet calibration procedure to determine and compensate for clock drift.

An advantage of this approach is that all BPDs 312 within wireless mesh network 102 may compensate for drift based on the highly accurate oscillators within CPDs 302. Another advantage of this approach is that the determined drift value may represent not only the drift of the oscillator, but also any temperature induced frequency variations caused by other components, including capacitors, and other temperature sensitive components.

Figure 5:
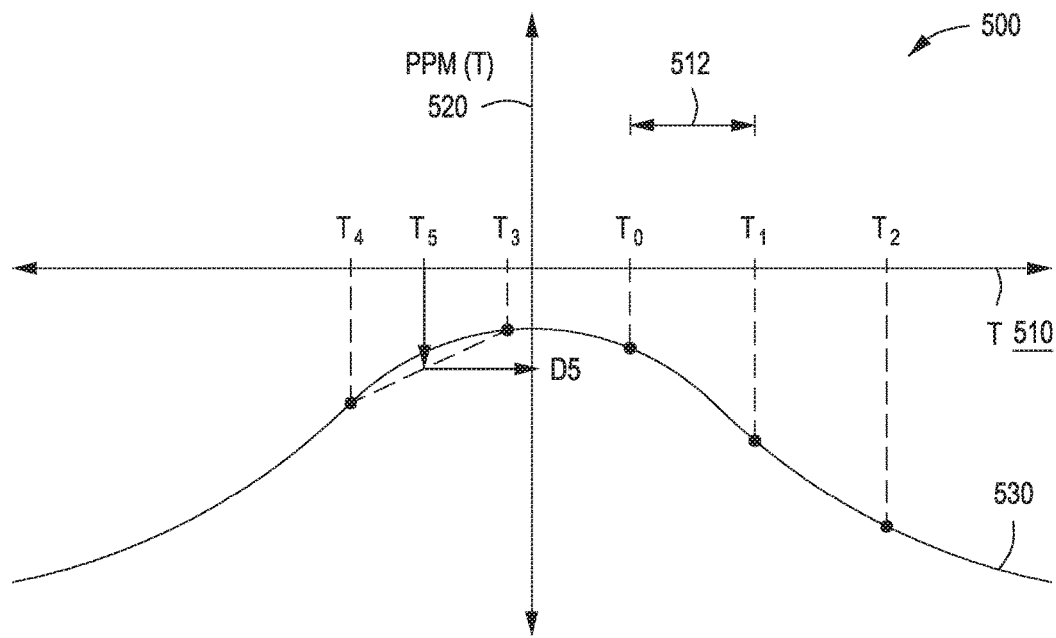
FIG. 5 is a graph of low frequency oscillator drift as a function of temperature, according to various embodiments of the present invention.

FIG. 5 is a graph of low frequency oscillator drift as a function of temperature, according to various embodiments of the present invention. As mentioned, when a given BPD 312 determines the current drift via the two packet calibration procedure, the BPD 312 records the current drift along with the current temperature. By recording many such pairs of current drift and current temperature, BPD 312 generates a dataset similar to that shown in exemplary form in FIG. 5.

As shown, graph 500 includes a temperature axis 510, a drift axis 520, and a plot 530 of drift as a function of temperature. Plot 530 is generally constructed as a collection of discrete coordinate pairs of the form (Ti, Di) where Ti is a temperature and Di is a drift value measured at that temperature via the two packet calibration technique. Plot 530 includes discrete coordinate pairs for temperatures T0, T1, T2, T3, and T4.

BPD 312 is configured to interpolate between coordinate pairs in order to estimate the drift at a specific temperature that has not be recorded by BPD 312. For example, to estimate the drift value for a temperature T5, BPD 312 performs a linear interpolation between the coordinate pairs associated with temperatures T3 and T4, and then based on this linear interpolation maps the temperature T5 to an estimated drift value D5. Based on this drift value D5, BPD 312 may then perform oscillator compensation.

BPD 312 is configured to request calibration packets from an upstream node at any given time and based on any set of conditions. In one embodiment, BPD 312 request calibration packets periodically. In practice, however, BPD 312 requests calibration packets from an upstream node upon detecting that insufficient data points exist to generate a reliably estimate of drift as a function of the current temperature.

For example, suppose BPD 312 only stores one coordinate pair associated with temperature T0. If the current temperature exceeds beyond a threshold 512 from temperature T0, then BPD 312 may determine that insufficient coordinate pairs exist to determine the current drift at, say, temperature T1. In this situation, BPD 312 would request calibration packets from an upstream node and then determine the current oscillator drift at temperature T1. BPD 312 would then expand the mapping of temperature to drift values based on this newly acquired drift measurement.

In short, whenever the current temperature is greater than or less than the temperature associated with a previously determined coordinate pair by a given threshold 512, BPD 312 may request a set of calibration packets and expand the dataset. In this manner, BPD 312 continuously improves the mapping of temperature to drift values based on changing environmental conditions.

Figure 6A:
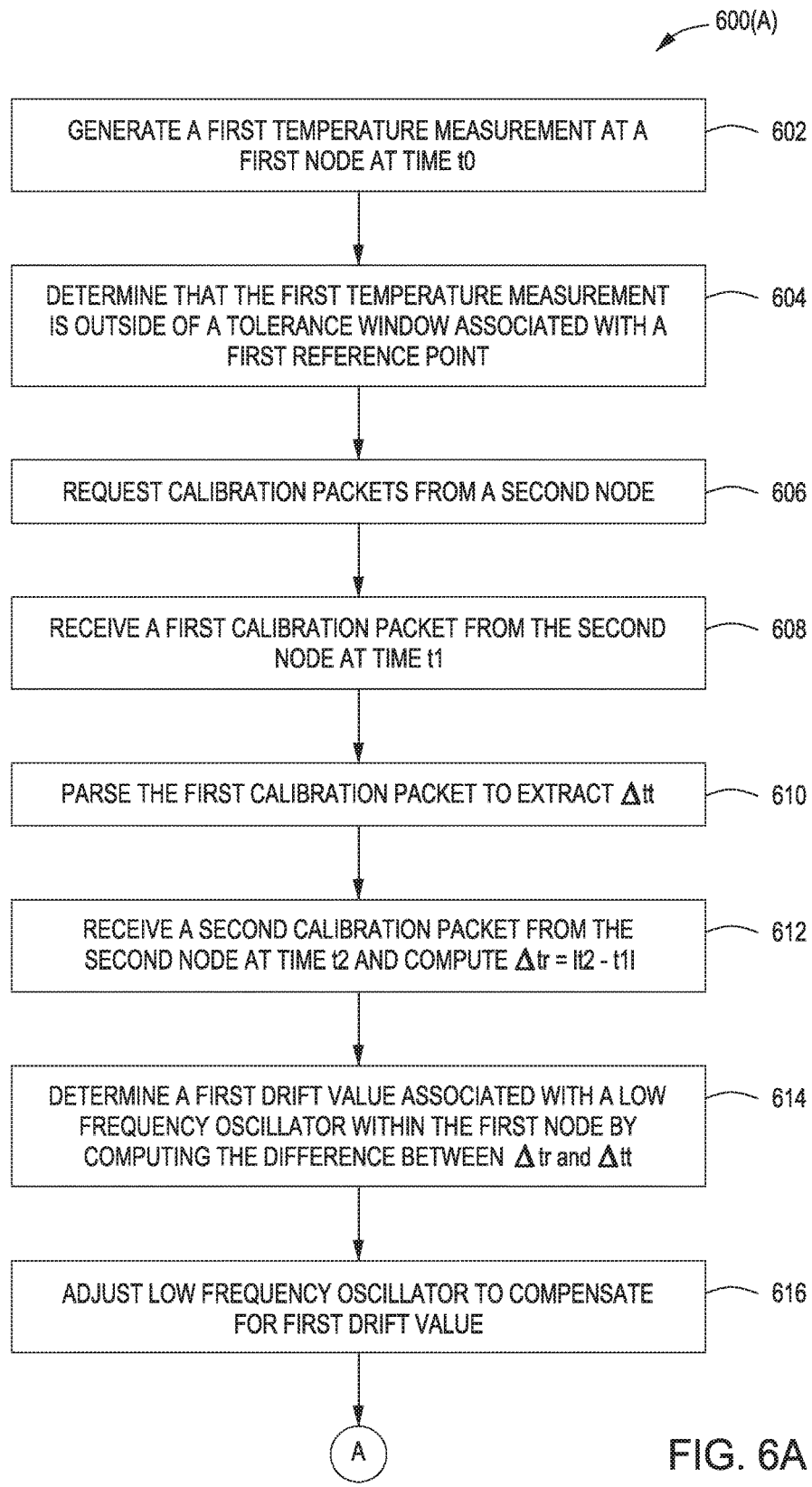
FIGS. 6A-6B illustrate a flow diagram of method steps for compensating for oscillator drift in a low frequency oscillator, according to various embodiments of the present invention.
Figure 6B:
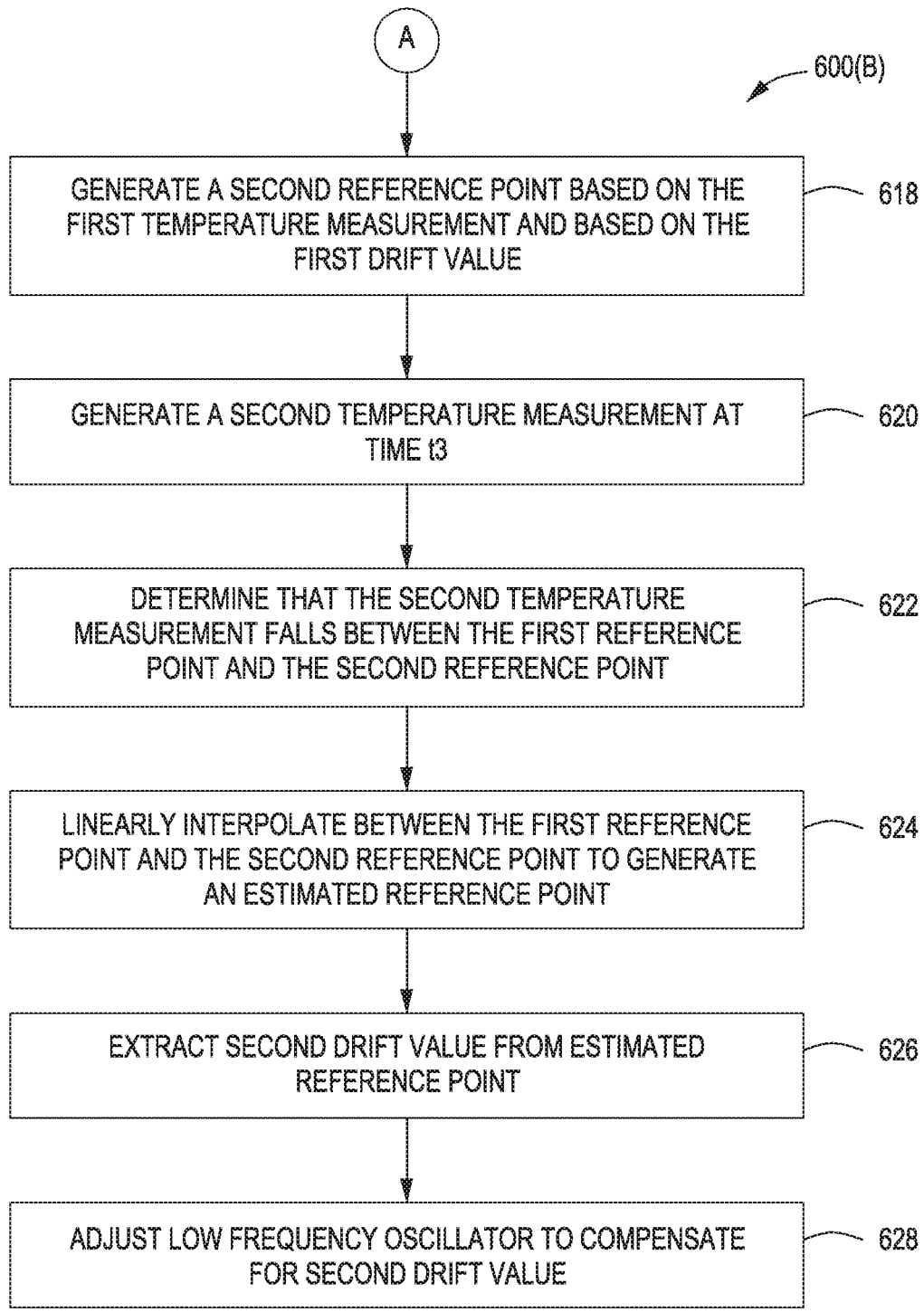

FIGS. 6A-6B illustrate a flow diagram of method steps for compensating for low frequency oscillator drift, according to various embodiments of the present invention. Although the method steps are described in conjunction with the systems of FIGS. 1-5, persons skilled in the art will understand that any system configured to perform the method steps, in any order, is within the scope of the present invention.

As shown in FIG. 6A, a method 600(A) begins at step 602, where a first node within wireless mesh network 102 generates a first temperature measurement at time t0. The first node may be a BPD 312 such as those shown in FIGS. 3A-4. The first node may implement temperature sensor 250 to generate the first temperature measurement. At step 604, the first node determines that the first temperature measurement is outside of a tolerance window associated with a first reference point. The tolerance window could be, for example, threshold 512 shown in FIG. 5. At step 606, the first node requests calibration packets from a second node. The second node may be an adjacent BPD 312 in the same or different hop layer as the first node, or the second node could be a CPD 302 within an adjacent hop layer.

At step 608, the first node receives a first calibration packet from the second node at time t1. At step 610, the first node parses the first calibration packet to extract Δtt. At step 612, the first node receives a second calibration packet from the second node at time t2 and computes Δtr=|t2−t1. At step 614, the first node determines a first drift value associated with an LF oscillator within the first node by computing the difference between Δtt and Δtr. To compensate for this drift, at step 616, the first node adjusts that LF oscillator or associated circuitry. The first node may also perform additional steps to expand a mapping between temperature and drift, as discussed below in conjunction with FIG. 6B.

As shown in FIG. 6B, the method 600(A) proceeds to the method 600(B). At step 618, the first node generates a second reference point based on the first temperature measurement and based on the first drift value. At step 620, the first node generates a second temperature measurement at time t3. At step 622, the first node determines that the second temperature measurement falls between the first reference point and the second reference point. At step 624, the first node linearly interpolates between the first reference point and the second reference point to generate an estimated reference point. At step 626, the first node extracts a second drift value from estimated reference point. At 628, the first node adjusts the LF oscillator to compensate for this second drift value.

Persons skilled in the art will recognize that the approach discussed above may be implemented, in whole or in part, to perform compensation for other types of oscillators that serve different purposes within a node 130. In particular, the technique for determining the relationship between temperature and drift may also be applied to perform ongoing compensation of high frequency oscillators, as described in greater detail below in conjunction with FIGS. 7-8.

Compensating for Drift of a High Frequency Oscillator

Figure 7:
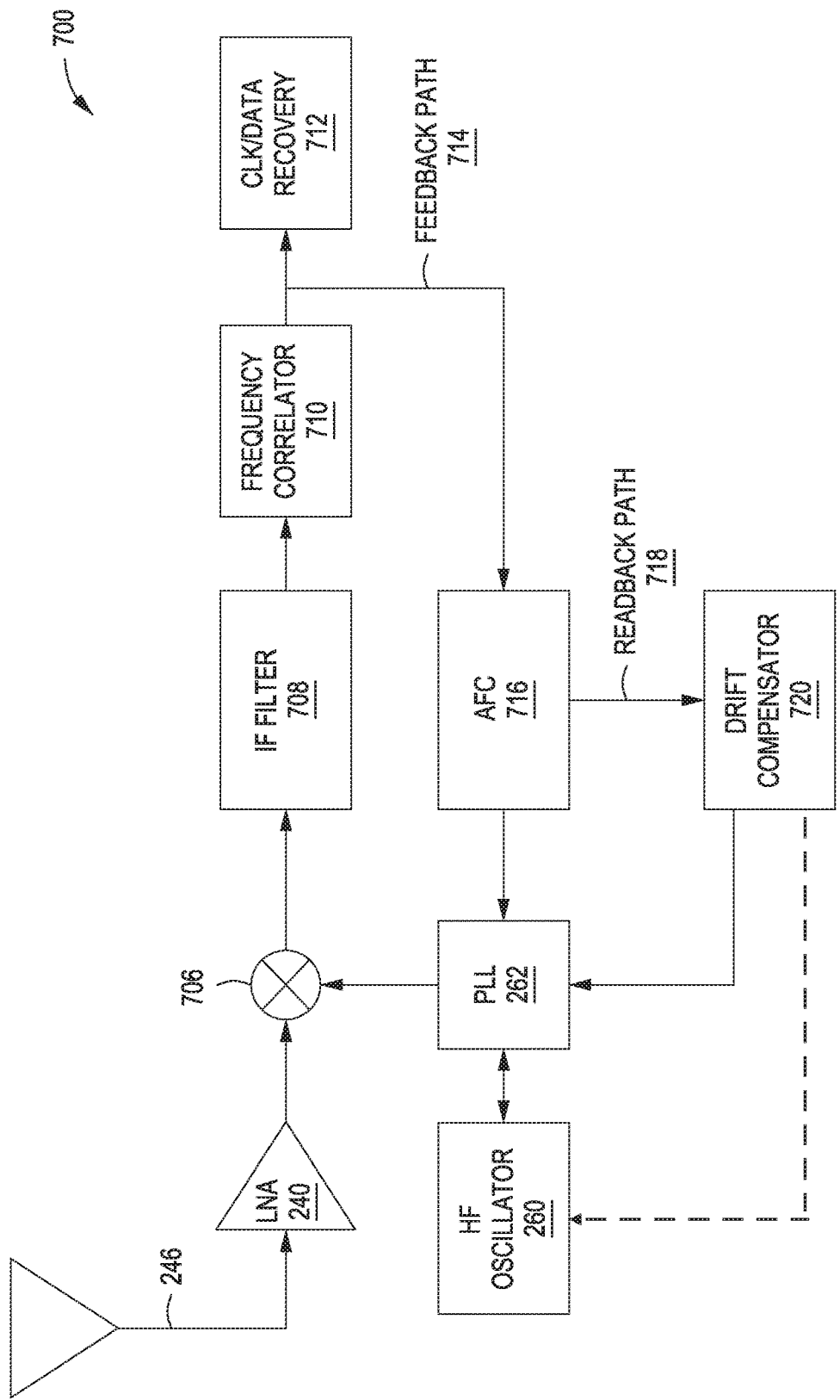
FIG. 7 illustrates high frequency receiver circuitry included in the network interface of FIG. 2, according to various embodiments of the present invention.

FIG. 7 illustrates high frequency receiver circuitry included in the network interface of FIG. 2, according to various embodiments of the present invention. As shown, receiver circuitry 700 includes antenna 246, LNA 240, analog mixer 706, intermediate frequency (IF) filter 708, frequency correlator 710, clock (clk)/data recovery 712, automatic frequency controller (AFC) 716, drift compensator 720, HF oscillator 260, and PLL 262.

Some elements shown in FIG. 7 are also shown in FIG. 2, including LNA 240, antenna 246, HF oscillator 260, and PLL 262. In addition, certain elements in FIG. 7 may be included within DSP 214 of FIG. 2, such as IF filter 708, frequency correlator 710, clk/data recovery 712, AFC 716, and in some embodiments drift compensator 720. Drift compensator 720 may also be implemented as a software module within calibration application 252. Drift compensator 720 is configured to interoperate with AFC 716 in order to compensate for temperature induced oscillator drift of HF oscillator 260.

In operation, antenna 246 receives radio signals associated with incoming transmissions sent from neighboring or upstream nodes. Those radio signals are typically encoded via frequency-shift keying (FSK), as is known in the art. LNA 240 amplifies incoming signals and then transmits the amplified signals to analog mixer 706. Analog mixer 706 may include analog mixers 226 and 227 configured to generate phase shifted versions of incoming signals for performing quadrature oriented operations. For simplicity, however, only one analog mixer 706 is shown.

Analog mixer 706 combines the amplified signal received from LNA 240 with a high frequency signal received from PLL 262 and then transmits the combined signal to IF filter 708. IF filter 708 processes the combined signal to determine an intermediate signal frequency associated with the received transmission. This intermediate signal frequency may, on average, be similar or equivalent to a frequency associated with an HF oscillator included within the upstream node.

Frequency correlator 710 correlates the intermediate signal frequency to FSK values fΔ+ and fΔ−. As known to those familiar with FSK, transmission on either fΔ+ or fΔ− conveys either a binary "0" or a binary "1." Frequency correlator 710 determines whether the intermediate signal frequency correlates more strongly to fΔ+ or fΔ−, and then interoperates with clk/data recovery 712 to decode either a "0" or a "1." Clk/data recovery 712 may accumulate many such decoded values to reconstruct a data packet transmitted from the upstream node.

Frequency correlator 710 is also configured to determine the degree to which measured values of fΔ+ and fΔ− diverge from expected values for these frequencies.

The expected values may be derived from configuration settings or statistical measurements of fΔ+ and fΔ−. Divergence may occur due to temperature induced drift of HF oscillator 260, referred to herein as $f_{drift}$. For example, at higher temperatures, HF oscillator 260 may oscillate more rapidly, causing the intermediate signal frequency to have an elevated value. In turn, fΔ+ and fΔ− may appear to be positively biased by an amount $f_{drift}$. Alternatively, at lower temperatures, HF oscillator 260 may oscillate more slowly, causing the intermediate signal frequency to have a diminished value. In turn, fΔ+ and fΔ− may appear to be negatively biased by $f_{drift}$.

For a limited range of temperature variations, frequency correlator 710 may be able to detect the value of $f_{drift}$. As a general matter, so long as $f_{drift}$ is small enough that fΔ+ and fΔ− remain within the upper and lower frequency bounds of the current receive channel, respectively, frequency correlator 710 may be able to determine $f_{drift}$. Frequency correlator 710 transmits the value of $f_{drift}$ to AFC 716, and AFC 716 may then adjust HF oscillator 260 and/or PLL 262 in order to compensate for that drift. Accordingly, for this limited range of temperature variations and associated range of $f_{drift}$ values, AFC 716 maintains relative synchronization between the high frequency signal output by PLL 262 and the radio signal received from the upstream node.

However, with excessive drift, one or more of fΔ+ and fΔ− may reside outside of the upper or lower frequency bounds for the current channel. In this situation, frequency correlator 710 is "saturated" and cannot reliably determine the current drift $f_{drift}$. This may prevent AFC 716 from performing the drift compensation discussed above. Consequently, the high frequency signal output by PLL 262 may lose relative synchronization with the radio signals received from the upstream node, potentially interfering with the decoding of binary values and the reconstruction of transmitted packets. This, in turn, may lead to repetitive packet loss.

However, drift compensator 720 performs specific techniques to address the above problems. Drift compensator 720 monitors readback path 718 of AFC 716 over a timespan and also records temperature measurements gathered via temperature sensor 250 over the timespan. AFC 716 may output the current drift $f_{drift}$ measured by frequency correlator 710 via readback path 718. AFC 716 may also output compensatory frequency adjustments applied to oscillator 260 and/or PLL 262 via readback path 718. By monitoring readback path 718, drift compensator 720 generates a mapping between temperature and drift for the limited range of temperature variations within which AFC 716 may effectively operate. This mapping may be similar to calibration data 254 of FIG. 2 and/or the dataset discussed above in conjunction with FIG. 5.

Based on this dataset, drift compensator 720 establishes saturation boundaries beyond which AFC 716 may not effectively operate. These saturation boundaries may represent constraints on temperature or drift. For example, temperature T5 shown in FIG. 5 could represent a saturation boundary that limits the temperature range within which AFC 716 can effectively operate. Likewise, drift D5 shown in FIG. 5 could represent a saturation boundary that limits the drift range within which AFC 716 can effectively operate.

When the current drift $f_{drift}$ exceeds beyond a saturation boundary, or when the current temperature exceeds beyond a saturation boundary (indicating that $f_{drift}$ exceeds a saturation boundary), drift compensator 720 applies adjustments to HF oscillator 260 and/or PLL 262. Drift compensator could, for example, apply changes to a capacitor network (not shown) coupled to PLL 262 in order to adjust the high frequency output of PLL 262. These adjustments operate to bring the high frequency output of PLL 262 back to the range of drift values for which frequency correlator 710 and AFC 716 may effectively interoperate for oscillator compensation purposes. Once drift compensator 720 has returned $f_{drift}$ to that effective range, frequency correlator 710 may again receive values of fΔ+ and fΔ− that permit accurate computation of $f_{drift}$, and AFC 716 may again compensate for that drift in the manner described.

In one embodiment, drift compensator 720 may extrapolate drift values outside of the effective temperature and/or drift range of AFC 716 based on the dataset described above. Accordingly, drift compensator 720 can determine whether the high frequency output of PLL 262 should be increased or decreased, despite potentially lacking a precise prediction of actual drift. For example, referring to FIG. 5, drift compensator 720 could extrapolate a drift value associated with temperature T2 by extrapolating plot 530 based on data points associated with temperatures T0 and T1. Drift compensator 720 may also update the dataset based on these predicted values. In this manner drift compensator 720 may perform a "coarse" frequency adjustment to compensate for a potentially imprecise drift value. Then, AFC 716 may perform a "fine" frequency adjustment once that current drift is returned to a range where AFC 716 can effectively operate.

With the above approach, a node 130 is capable of synchronizing high frequency oscillation signals to those associated with an upstream node over a wider range of temperature values than possible with conventional approaches. Accordingly, the node 130 may receive incoming data transmissions from the upstream node with a greater success rate and a lower rate of data loss. The node 130 may therefore limit the amount of time required to power on and receive data transmissions from the upstream node, thereby conserving power.

Figure 8:
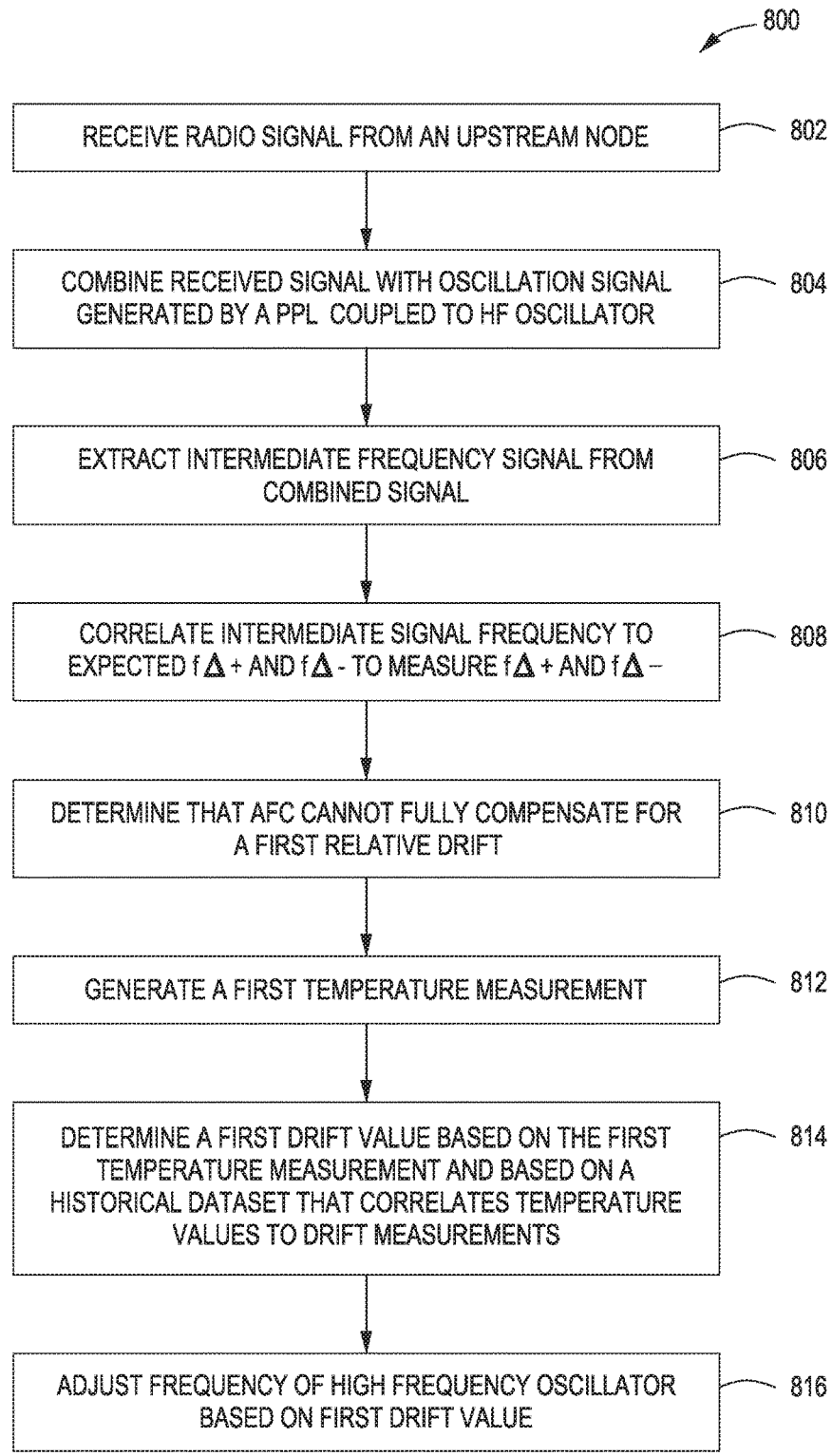
FIG. 8 is a flow diagram of method steps for compensating for oscillator drift in a high frequency oscillator, according to various embodiments of the present invention.

FIG. 8 is a flow diagram of method steps for compensating for oscillator drift in a high frequency oscillator, according to various embodiments of the present invention. Although the method steps are described in conjunction with the systems of FIGS. 1-5, persons skilled in the art will understand that any system configured to perform the method steps, in any order, is within the scope of the present invention.

As shown, a method 800 begins at step 802, where a node 130 receives a radio signal from an upstream node. The node 130 is BPD 312 residing in BPD mesh 310. The upstream node may be another BPD 312 residing in an upstream hop layer of BPD mesh 310, or a CPD 302 residing in CPD mesh 300. At step 804, analog mixer 706 within receiver circuitry 700 of the node 130 combines the received signal with a high frequency oscillation signal generated by PLL 262. At step 806, IF filter 708 within receiver circuitry 700 extracts an intermediate frequency signal from the combined signal. At step 808, frequency correlator 710 correlates the intermediate signal frequency with expected fΔ+ and fΔ− values to generate measurements of fΔ+ and fΔ−. Based on these measurements, frequency correlator 710 may determine a first relative drift, referred to above as $f_{drift}$. The first relative drift value may vary in accuracy depending on the degree to which fΔ+ and fΔ− fall within the bandwidth boundaries associated with the current receive channel.

At step 810, drift compensator 720 determines that AFC 716 cannot fully compensate for the first relative drift. Drift compensator 720 may evaluate the first relative drift based on a historical dataset that indicates drift as a function of temperature such as that shown in FIG. 5. The dataset may also indicate saturation boundaries specifying particular temperature values and/or drift values beyond which AFC 716 cannot effectively operate. If the current drift value resides at or beyond a saturation boundary, drift compensator 720 triggers additional compensatory actions in the manner described below.

At step 812, drift compensator 720 generates a first temperature measurement via interaction with temperature sensor 250. At step 814, drift compensator 720 determines a first drift value based on the first temperature measurement and based on the historical dataset mentioned above. Again, the historical dataset correlates temperature values to drift measurements. Drift compensator 720 may extrapolate the dataset based on the first relative drift measurement and potentially based on other recent drift measurements. For example, drift compensator 720 could establish an approximate direction and magnitude associated with changes in the current drift value, and then estimate the first drift value based on the first temperature measurement. At step 816, drift compensator 720 adjusts the high frequency output associated with HF oscillator 260 and/or PLL 262 to better match the frequency associated with the received radio signal. This high frequency output may then better match the frequency associated with an HF oscillator included in the upstream node.

By implementing the method 800, the node 130 may receive incoming data transmissions in a more robust manner compared to conventional techniques. Accordingly, the node 130 may implement more precisely timed communication windows and therefore conserve power.

In sum, a battery powered node within a wireless mesh network maintains a mapping between temperature and oscillator drift and compensates for oscillator drift based on this mapping. When the mapping includes insufficient data points to map the current temperature to an oscillator drift value, the battery powered node requests calibration packets from an adjacent node in the network. The adjacent node transmits two calibration packets with a transmit time delta and also indicates this time delta in the first calibration packet. The battery powered node receives the two calibration packets and measures the receive time delta. The battery powered node compares the transmit time delta to the receive time delta to determine oscillator drift compared to an oscillator in the adjacent node. The battery powered node then updates the mapping based on the current temperature and determined oscillator drift.

At least one advantage of the techniques described herein is that battery powered nodes can compensate for temperature induced oscillator drift based on the highly accurate oscillators included in continuously powered devices, without implementing power consuming TCXO techniques. Accordingly, battery powered nodes can coordinate specific time intervals to power on and perform data communications with high precision, thereby conserving power.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. A computer-implemented method for compensating for oscillator drift, the method comprising:
   obtaining a first drift measurement from an active frequency control (AFC) module, wherein the first drift measurement indicates a first amount of drift associated with a first oscillator;
   determining that the first drift measurement is greater than a saturation boundary associated with the AFC module, wherein the AFC module does not compensate for drift exceeding the first saturation boundary; and
   adjusting a high frequency output associated with the first oscillator to compensate for at least a portion of the first amount of drift.

2. The computer-implemented method of claim 1, further comprising:
   obtaining a second drift measurement from the AFC module, wherein the second drift measurement indicates a second amount of drift associated with the first oscillator;
   determining that the second drift measurement is less than the first saturation boundary; and ceasing to adjust the high frequency output of the first oscillator to allow the AFC to compensate for the second amount of drift.

3. The computer-implemented method of claim 1, wherein the first saturation boundary is included in a first data set that comprises a mapping between ambient temperature and various amounts of drift associated with first oscillator.

4. The computer-implemented method of claim 3, further comprising generating the first data set by:
obtaining a second drift measurement from the AFC module, wherein the second drift measurement indicates a second amount of drift associated with the first oscillator;
obtaining a first temperature measurement from a temperature sensor, wherein the first temperature measurement corresponds to the second drift measurement; and
updating the first data set to include a mapping between the first temperature measurement and the second drift measurement.

5. The computer-implemented method of claim 3, further comprising extrapolating the first data set beyond the first saturation boundary to generate a first drift estimate, wherein the high frequency output associated with the first oscillator is adjusted based on the first drift estimate.

6. The computer-implemented method of claim 1, wherein the first oscillator is coupled to a phase-locked loop (PLL) that generates the high frequency output, and wherein adjusting the high frequency output associated with the first oscillator comprises modifying the PLL or the first oscillator.

7. The computer-implemented method of claim 6, wherein modifying the first oscillator comprises changing a capacitance value of a first capacitor associated with the first oscillator.

8. The computer-implemented method of claim 1, wherein the first drift measurement further indicates the first amount of drift associated with the first oscillator relative to an oscillation frequency associated with a second oscillator, wherein the second oscillator resides in a first node that transmits a data signal to a second node that includes the first oscillator.

9. The computer-implemented method of claim 8, wherein a frequency correlator included in the second node generates the first drift measurement based on a set of frequencies associated with the data signal, and the set of frequencies is generated based on a frequency-key shifting (FSK) communication protocol.

10. A node, comprising:
a memory storing a calibration application; and
a processor that, upon executing the calibration application, performs the steps of:
obtaining a first drift measurement from an active frequency control (AFC) module, wherein the first drift measurement indicates a first amount of drift associated with a first oscillator,
determining that the first drift measurement is greater than a saturation boundary associated with the AFC module, wherein the AFC module does not compensate for drift exceeding the first saturation boundary, and
adjusting a high frequency output associated with the first oscillator to compensate for at least a portion of the first amount of drift.

11. The node of claim 10, wherein the processor further performs the steps of:

obtaining a second drift measurement from the AFC module, wherein the second drift measurement indicates a second amount of drift associated with the first oscillator;
determining that the second drift measurement is less than the first saturation boundary; and
ceasing to adjust the high frequency output of the first oscillator to allow the AFC to compensate for the second amount of drift.

12. The node of claim 10, wherein the first saturation boundary is included in a first data set that comprises a mapping between ambient temperature and various amounts of drift associated with first oscillator.

13. The node of claim 12, wherein the processor generates first data set by:
obtaining a second drift measurement from the AFC module, wherein the second drift measurement indicates a second amount of drift associated with the first oscillator;
obtaining a first temperature measurement from a temperature sensor, wherein the first temperature measurement corresponds to the second drift measurement; and
updating the first data set to include a mapping between the first temperature measurement and the second drift measurement.

14. The node of claim 12, wherein the processor further performs the step of extrapolating the first data set beyond the first saturation boundary to generate a first drift estimate, wherein the high frequency output associated with the first oscillator is adjusted based on the first drift estimate.

15. The node of claim 10, wherein the first oscillator is coupled to a phase-locked loop (PLL) that multiplies output of the first oscillator to generate the high frequency output, and wherein adjusting the high frequency output associated with the first oscillator comprises modifying the PLL.

16. The node of claim 15, wherein the processor modifies the PLL by modifying a capacitor network coupled to the PLL.

17. The node of claim 10, wherein the first drift measurement further indicates the first amount of drift associated with the first oscillator relative to an oscillation frequency associated with a second oscillator, wherein the second oscillator resides in an upstream node that transmits a data signal to the node.

18. The node of claim 17, wherein a frequency correlator included in the node generates the first drift measurement based on a frequency pair via which the data signal is transmitted, wherein each frequency in the frequency pair indicates a different binary value associated with the data signal.

19. A system, comprising:
a first node that transmits a data signal; and
a second node that receives the data signal from the first node and performs the steps of:
obtaining a first drift measurement from an active frequency control (AFC) module, wherein the first drift measurement indicates a first amount of drift associated with a first oscillator;
determining that the first drift measurement is greater than a saturation boundary associated with the AFC module, wherein the AFC module does not compensate for drift exceeding the first saturation boundary; and
adjusting a high frequency output associated with the first oscillator to compensate for at least a portion of the first amount of drift.

20. The system of claim 19, wherein the second node further performs the steps of:
- obtaining a second drift measurement from the AFC module, wherein the second drift measurement indicates a second amount of drift associated with the first oscillator;
- determining that the second drift measurement is less than the first saturation boundary; and
- ceasing to adjust the high frequency output of the first oscillator to allow the AFC to compensate for the second amount of drift.

* * * * *